US009633732B2

(12) United States Patent
Lee

(10) Patent No.: US 9,633,732 B2
(45) Date of Patent: Apr. 25, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/040,113

(22) Filed: Feb. 10, 2016

(65) Prior Publication Data

US 2017/0092365 A1    Mar. 30, 2017

(30) Foreign Application Priority Data

Sep. 24, 2015   (KR) .......................... 10-2015-0135708

(51) Int. Cl.
| | |
|---|---|
| *G11C 16/10* | (2006.01) |
| *G11C 16/24* | (2006.01) |
| *G11C 16/04* | (2006.01) |
| *G11C 16/34* | (2006.01) |

(52) U.S. Cl.
CPC .......... *G11C 16/10* (2013.01); *G11C 16/0483* (2013.01); *G11C 16/24* (2013.01); *G11C 16/3427* (2013.01)

(58) Field of Classification Search
CPC . G11C 16/10; G11C 16/3427; G11C 16/0483; G11C 16/24
See application file for complete search history.

(56) References Cited

U.S. PATENT DOCUMENTS

| | | | | |
|---|---|---|---|---|
| 2014/0043915 | A1* | 2/2014 | Choi ...................... | G11C 16/10 365/185.25 |
| 2015/0103592 | A1* | 4/2015 | Miwa ................. | G11C 16/0483 365/185.02 |
| 2015/0155040 | A1* | 6/2015 | Shim ...................... | G11C 16/10 365/185.25 |
| 2015/0179266 | A1* | 6/2015 | Park ....................... | G11C 16/10 365/185.2 |
| 2016/0099066 | A1* | 4/2016 | Dunga .................. | G11C 16/24 365/185.17 |

FOREIGN PATENT DOCUMENTS

| | | |
|---|---|---|
| KR | 1020110009503 A | 1/2011 |
| KR | 1020140020628 A | 2/2014 |

* cited by examiner

*Primary Examiner* — Harry W Byrne
*Assistant Examiner* — Ajay Ojha
(74) *Attorney, Agent, or Firm* — William Park & Associates Ltd.

(57) ABSTRACT

A semiconductor memory device may include a memory cell array, a peripheral circuit, a control logic, and a source line precharge path. The memory cell array may have a plurality of memory strings. The peripheral circuit may perform a program operation for the memory cell array. The control logic may control the peripheral circuit a channel precharge operation of the program operation. The source line precharge path may precharge channels of the plurality of memory strings through a source line of the memory cell array. The peripheral circuit may control, according to program data, a potential level of a selected one of a plurality of bit lines coupled to the plurality of memory strings during the channel precharge operation.

19 Claims, 8 Drawing Sheets

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2015-0135708 filed on Sep. 24, 2015 in the Korean Intellectual Property Office, the entire disclosure of which is incorporated herein by reference.

BACKGROUND

1. Technical Field

Various embodiments of the present disclosure generally relate to an electronic device, and more particularly to a semiconductor memory device and an operating method thereof.

2. Related Art

Semiconductor memory devices may be classified into volatile memory devices and nonvolatile memory devices.

The nonvolatile memory device can retain data stored therein even when power is shut off or interrupted. The nonvolatile memory device may be used for the task of data storage devices. Examples of the nonvolatile memory device may include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory devices may be classified into NOR type and NAND type.

The flash memory devices may work like both RAM and ROM. Like RAM, data can be written to flash memory, but, like ROM, that data can be retained even when power is interrupted. The flash memory devices are widely used as data storage devices of portable electronic devices such as a digital camera, a personal digital assistant (PDA) and MP3.

DETAILED DESCRIPTION

Figure 1:
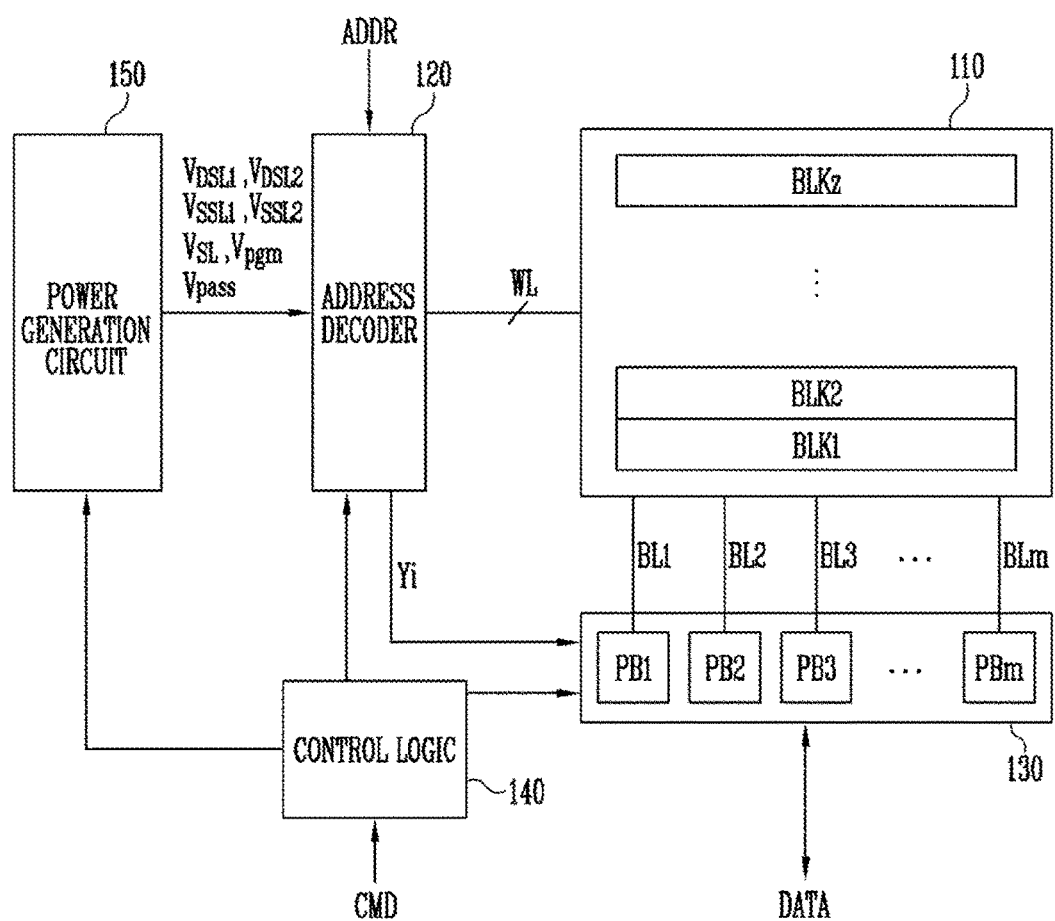
FIG. 1 is a diagram illustrating an example of a semiconductor memory device according to an embodiment of the present disclosure.

Various embodiments of the present provide a semiconductor memory device cable of mitigating a program disturb phenomenon which may occur on an unselected memory string during a program operation of the semiconductor memory device, and a method for operating the semiconductor memory device.

In an embodiment, a semiconductor memory device may include a memory cell array, a peripheral circuit, a control logic, and a source line precharge path. The memory cell array may have a plurality of memory strings. The peripheral circuit may perform a program operation for the memory cell array. The control logic may control the peripheral circuit a channel precharge operation of the program operation. The source line precharge path may precharge channels of the plurality of memory strings through a source line of the memory cell array. The peripheral circuit may control, according to program data, a potential level of a selected one of a plurality of bit lines coupled to the plurality of memory strings during the channel precharge operation.

An embodiment of the present disclosure provides a method for operating a semiconductor memory device, including providing a memory cell block including a plurality of memory strings coupled between a plurality of bit lines and one or more source lines, precharging channels of the plurality of memory strings through the one or more source lines, controlling a potential level of a selected one of the bit lines according to program data while precharging the channels of the plurality of memory strings, and electrically coupling a selected one of the plurality of memory strings to the selected bit line and applying a program voltage thereto.

An embodiment of the present disclosure provides a method for operating a semiconductor memory device, including providing a memory cell block including a plurality of memory strings coupled between a plurality of bit lines and one or more source lines; precharging channels of the plurality of memory strings through the one or more source lines, controlling a potential level of the bit lines according to program data while precharging the channels of the plurality of memory strings, and electrically coupling a selected one of the plurality of memory strings to the bit lines, and applying a program voltage thereto.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Advantages and features of the present disclosure, and methods for achieving the same will be cleared with reference to exemplary embodiments described later in detail together with the accompanying drawings. Accordingly, the present disclosure is not limited to the following embodiments but embodied in other types. Rather, these embodiments are provided so that the present disclosure will be thorough, and complete, and will fully convey the technical spirit of the disclosure to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

Referring to FIG. 1, a semiconductor memory device 100 may include a memory cell array 110, an address decoder 120, a read-and-write circuit 130, a control logic 140, and a voltage generation circuit 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read-and-write circuit 130 through bit lines BL1 to BLm. The bit lines BL1 to BLm may be divided into an even-numbered bit line group and an odd-numbered bit line group. Each of the memory blocks BLK1 to BLKz includes a plurality of memory cells. The memory cells may have layers that can store electrical charges. In an embodiment, the memory cells may store electrical charges in floating gates. In an embodiment, the memory cells may store electrical charges in charge-trapping layers made of an insulator. A predetermined number of memory cells coupled to the same word line may be defined as one page, and a plurality of pages may be combined into the memory blocks BLK1 to BLKz. Each of the memory blocks BLK1 to BLKz of the memory cell array 110 may include a plurality of memory strings. Each of the memory strings may include a drain select transistor cell, a plurality of memory cells, and a source select transistor cell coupled in series between a corresponding bit line and a source line.

A detailed configuration of the plurality of memory blocks BLK1 to BLKz will be described later herein.

The address decoder 120, the read-and-write circuit 130, and the voltage generation circuit 150 may function as peripheral circuits for driving the memory cell array 110.

The address decoder 120 may be coupled to the memory cell array 110 through the word lines WL. The address decoder 120 may operate under the control of the control logic 140. The address decoder 120 may receive an address ADDR through an input/output buffer (not illustrated) provided in the semiconductor memory device 100.

During a channel precharge operation of a program operation, the address decoder 120 may apply first and second drain select line voltage VDSL1 and VDSL2, first and second source select line voltage VSSL1 and VSSL2, and a source line voltage VSL, which are generated from the voltage generation circuit 150, to first and second drain select lines, first and second source select lines, and a source line of a selected memory block, respectively. During a program voltage applying operation of the program operation, the address decoder 120 may apply a program voltage Vpgm and a pass voltage Vpass, which are generated from the voltage generation circuit 150, to the word lines WL of a selected memory block.

The address decoder 120 may decode a column address, which is a part of addresses ADDR received during a read operation. The address decoder 120 may transmit the decoded column address Yi to the read-and-write circuit 130.

The program operation of the semiconductor memory device 100 may be performed on a page basis. The addresses ADDR received together with a request for the program operation may include a block address, a row address, and a column address. The address decoder 120 may select a corresponding one of the memory blocks and a corresponding one of the word lines in accordance with the block address and the row address. The column address may be decoded by the address decoder 120 and provided to the read-and-write circuit 130.

The address decoder 120 may include a block decoder, a row decoder, a column decoder, an address buffer, etc.

The read-and-write circuit 130 may include a plurality of page buffers PB1 to PBm. The page buffers PB1 to PBm may be coupled to the memory cell array 110 through the bit lines BL1 to BLm. Each of the page buffers PB1 to PBm may temporarily store data DATA inputted during the program operation and control potential levels of the bit lines BL1 to BLm. For example, each of the page buffers PB1 to PBm may control the potential level of a corresponding bit line such that, when a data bit inputted during the program operation is at a logic-low level (e.g., "0"), a corresponding paga buffer PB1, . . . , or PBm sets the potential level of the bit line to a program allowable voltage (e.g., 0V), and when the inputted data bit is at a logic-high level (e.g., "1"), the corresponding paga buffer PB1, . . . , or PBm sets the potential level of the bit line to a program inhibit voltage (e.g., VDD).

During a program verification operation, the read-and-write circuit 130 may determine whether the program operation has been completed on a certain memory cell by sensing a potential level of a corresponding bit line BL1, . . . , or BLm of the memory cell array 110.

The read-and-write circuit 130 may operate under the control of the control logic 140.

In an embodiment, the read-and-write circuit 130 may include page buffers (e.g., page resistors), a column select circuit, and so forth.

The control logic 140 may be coupled to the address decoder 120, the read-and-write circuit 130, and the voltage generator 150. The control logic 140 may receive a command CMD through an input/output buffer (not illustrated) of the semiconductor memory device 100. The control logic 140 may control the overall operation of the semiconductor memory device 100 in response to the command CMD.

The control logic 140 may control the address decoder 120 and the voltage generation circuit 150 such that, during a channel precharge operation of the program operation, channels of a selected memory block are precharged through a source line. In an embodiment, a source line precharge path, which is a path connecting the source line and the channels of the selected memory block, may be provided to precharge the channels of the plurality of memory strings through the source line of the memory cell array. The control logic 140 controls the read-and-write circuit 130 such that, during the program operation, the read-and-write circuit 130 temporarily stores data inputted from the outside and controls the potential levels of the corresponding bit lines BL in response to the data.

During the channel precharge operation of the program operation, the voltage generation circuit 150 may generate, under the control of the control logic 140, first and second drain select line voltages VDSL1 and VDSL2, first and second source select line voltages VSSL1 and VSSL2, and a source line voltage VSL, and may output them to the address decoder 120. During a program voltage application operation of the program operation, the voltage generation circuit 150 generates, under the control of the control logic 140, a program voltage Vpgm and a pass voltage Vpass and outputs them to the address decoder 120.

Figure 2:
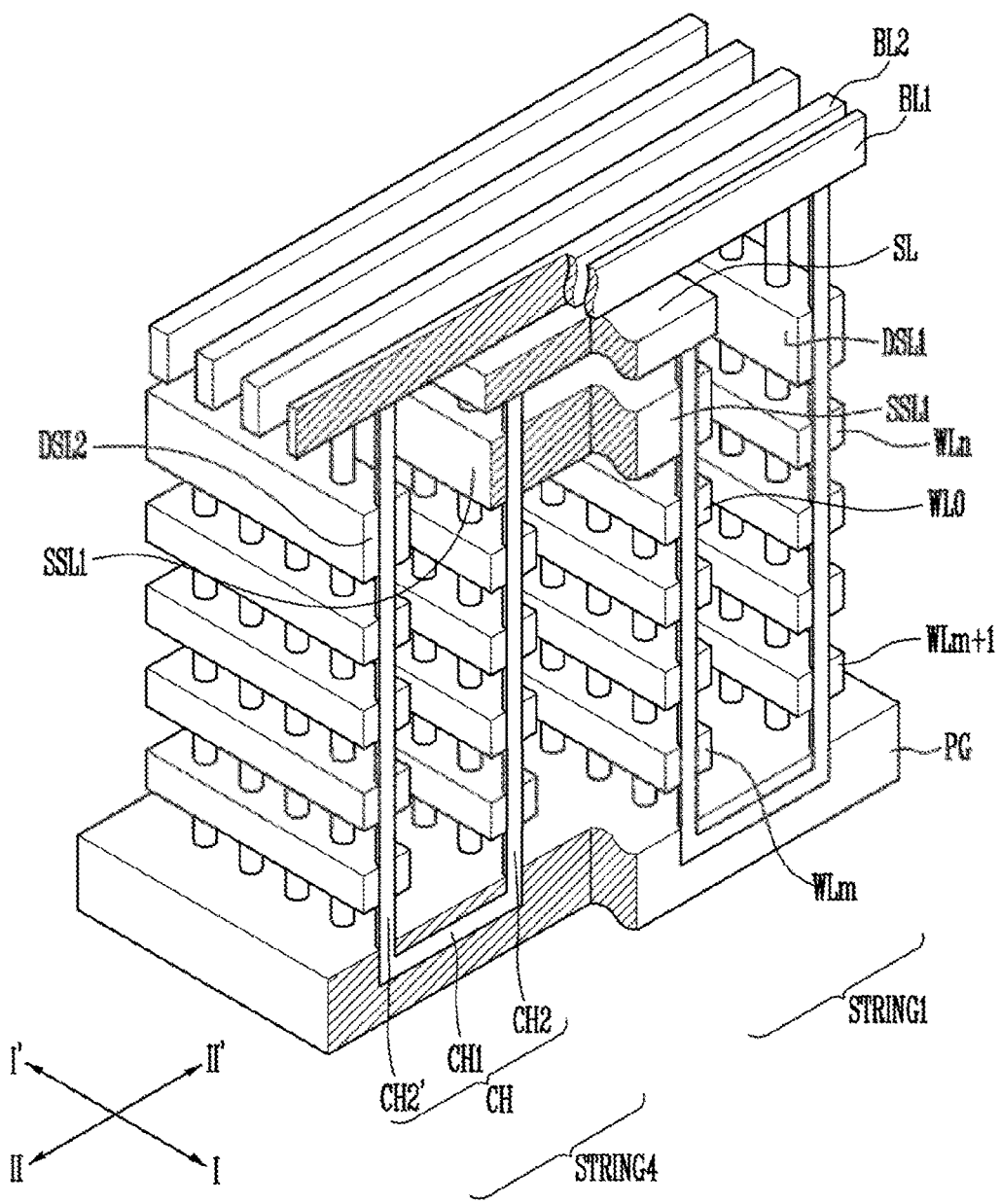
FIG. 2 is a diagram illustrating an example of a memory block having a three-dimensional structure in accordance with an embodiment of the present disclosure.

FIG. 2 is a diagram illustrating an example of a memory block having a three-dimensional structure in accordance with an embodiment of the present disclosure.

Figure 3:
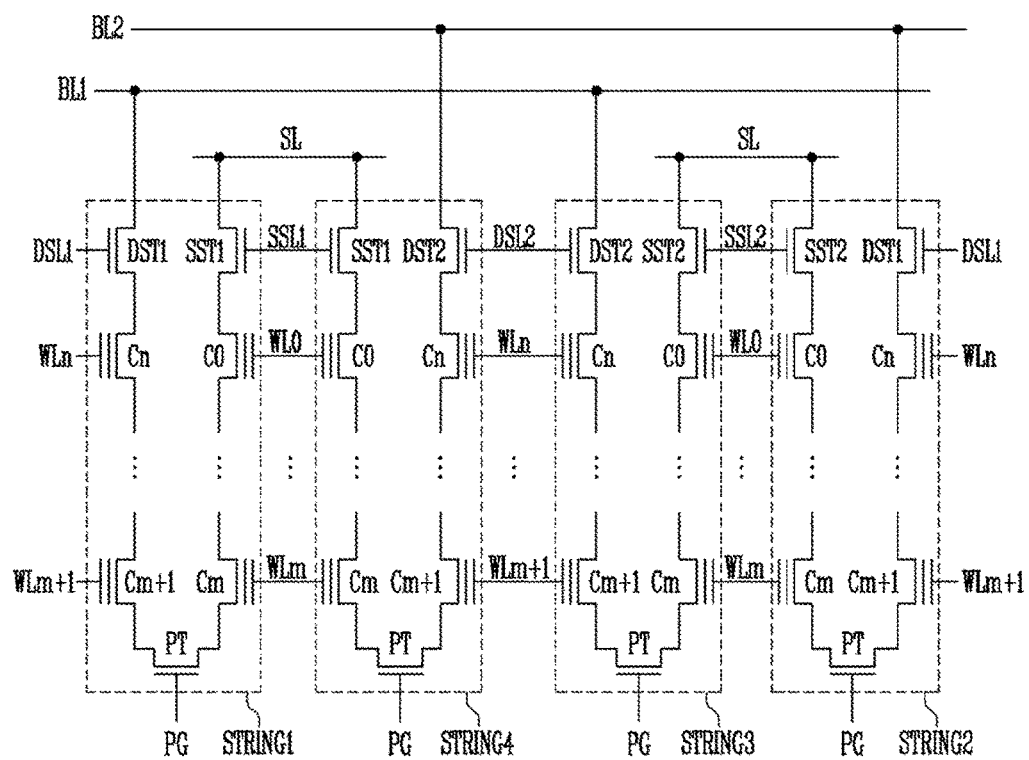
FIG. 3 is a diagram illustrating an example of the memory block having a three-dimensional structure in accordance with an embodiment of the present disclosure.

FIG. 3 is a diagram illustrating an example of the memory block having a three-dimensional structure in accordance with an embodiment of the present disclosure.

The memory block of the semiconductor memory device according to an embodiment of the present disclosure will be described with reference to FIGS. 2 and 3.

Although, as shown in FIG. 1, the memory block according to an embodiment of the present disclosure may include a plurality of memory strings coupled to a plurality of bit lines BL1 to BLm, only memory strings STRING1 to STRING4 coupled to a first bit line BL1 and a second bit line BL2 will be illustrated and described for the purpose of convenience in description. The first bit line BL1 refers to an odd-numbered bit line, and the second bit line BL2 refers to an even-numbered bit line.

The memory block may include the plurality of memory strings STRINGS1 to STRIGN4, the plurality of bit lines BL1 and BL2, and a source line SL.

Each of the memory strings STRINGS1 to STRIGN4 may include a source select transistor SST, memory cells C0 to Cn, and a drain selector transistor DST, which are vertically arranged over a substrate and coupled in series to one another.

The first bit line BL1 may be coupled to the drain select transistors DST1 and DST2 of odd-numbered memory strings STRING1 and STRING3. The second bit line BL2 may be coupled to the drain select transistors DST1 and DST2 of even-numbered memory strings STRING2 and STRING4. The source line SL may be coupled to the source select transistors SST1 and SST2 of the memory strings STRING1 to STRING4.

The odd-numbered memory strings STRING1 and STRING3 coupled to the first bit line BL1 and the even-numbered memory strings STRING2 and STRING4 coupled to the second bit line BL2 may be alternately arranged. The odd-numbered memory strings STRING1 and STRING3 and the even-numbered memory strings STRING2 and STRING4 may be arranged to form a symmetrical structure.

Each of the memory strings STRING1 to STRING4 may further include a pipe transistor PT formed on the substrate. In a symmetrical structure including the pipe transistor PT formed on the substrate, some memory cells Cm+1 to Cn of the memory cells C0 to Cn may be vertically arranged and coupled in series to one another between the pipe transistor PT and the drain select transistor DST1, and the other memory cells C0 to Cm may be vertically arranged and coupled in series to one another between the pipe transistor PT and the source select transistor SST1. In the memory block, pipe gates PG of the pipe transistors PT may be coupled to each other.

The memory cells C0 to Cn included in the plurality of memory strings STRING1 to STRING4 may share the word lines WL0 to WLn. The word lines WL0 to WLm of the cells C0 to Cm coupled between the pipe transistor PT and the source select transistor SST1 may refer to source side word lines. The word lines WLm+1 to WLn of the cells Cm+1 to Cn coupled between the pipe transistor PT and the drain select transistor DST1 may refer to drain side word lines. In each memory block, corresponding lines of the source side word lines WL0 to WLm and the drain side word lines WLm+1 to WLn may be formed in the same layer while being electrically separated from each other. The drain select lines DSL1 and DSL2 coupled to the drain select transistors DST1 and DST2 coupled to the same bit line (e.g., BL1) may be separated from each other. The source select lines SSL1, SSL2 coupled to the source select transistors SST1, SST2 in the memory block may be coupled to each other.

The plurality of bit lines BL1 and BL2 and the source line SL may be formed in directions crossing each other. The bit lines BL1 and BL2 and the source line SL may be formed in different layers.

The source select line SSL1 and the source side word lines WL0 to WLm may be formed between the source line SL and the pipe transistor PT. For example, source select line SSL1 and the source side word lines WL0 to WLm may be stacked sequentially. A first vertical channel layer CH2 coupled between the source line SL and the pipe transistor PT may pass through the source select line SSL1 and the source side word lines WL0 to WLm. A multilayer film (not illustrated) including a tunnel insulation layer, a charge storage layer, and a blocking insulation layer may be formed between the first vertical channel layer CH2 and the source side word lines WL0 to WLm. The source select transistor SST1 and the memory cells C0 to Cm in which the first vertical channel layer CH2 are enclosed by the source select line SSL1 and the source side word lines WL0 to WLm may be formed vertically from the substrate.

The drain select line DSL1 and the drain side word lines WLm+1 to WLn may be formed between the first bit line BL1 and the pipe transistor PT. For example, the drain select line DSL1 and the drain side word lines WLm+1 to WLn may be stacked sequentially. A second vertical channel layer CH2' coupled between the first bit line BL1 and the pipe transistor PT may pass through the drain select line DSL1 and the drain side word lines WLm+1 to WLn. A multilayer film (not illustrated) including a tunnel insulation layer, a charge storage layer, and a blocking insulation layer may be formed between the second vertical channel layer CH2' and the drain side word lines WLm+1 to WLn. The drain select transistor DST1 and the memory cells Cm+1 to Cn in which the second vertical channel layer CH2' that are enclosed by the drain select line DSL1 and the drain side word lines WLm+1 to WLn may be formed vertically from the substrate.

A multilayer film including a tunnel insulation layer, a charge storage layer, and a blocking insulation layer may be formed between a pipe channel layer CH1 and the corresponding pipe gate PG.

The first vertical channel layer CH2 and the second vertical channel layer CH2' may be coupled to each other by the pipe channel CH1 of the pipe transistor PT. As a result, each of the memory strings STRING1 to STRING4 may have a U-shaped vertical channel layer CH. The drain select transistor DST1, the memory cells C0 to Cn, and the source select transistor SST1 may be coupled in series between the bit line BL1 and the source line SL.

Figure 4:
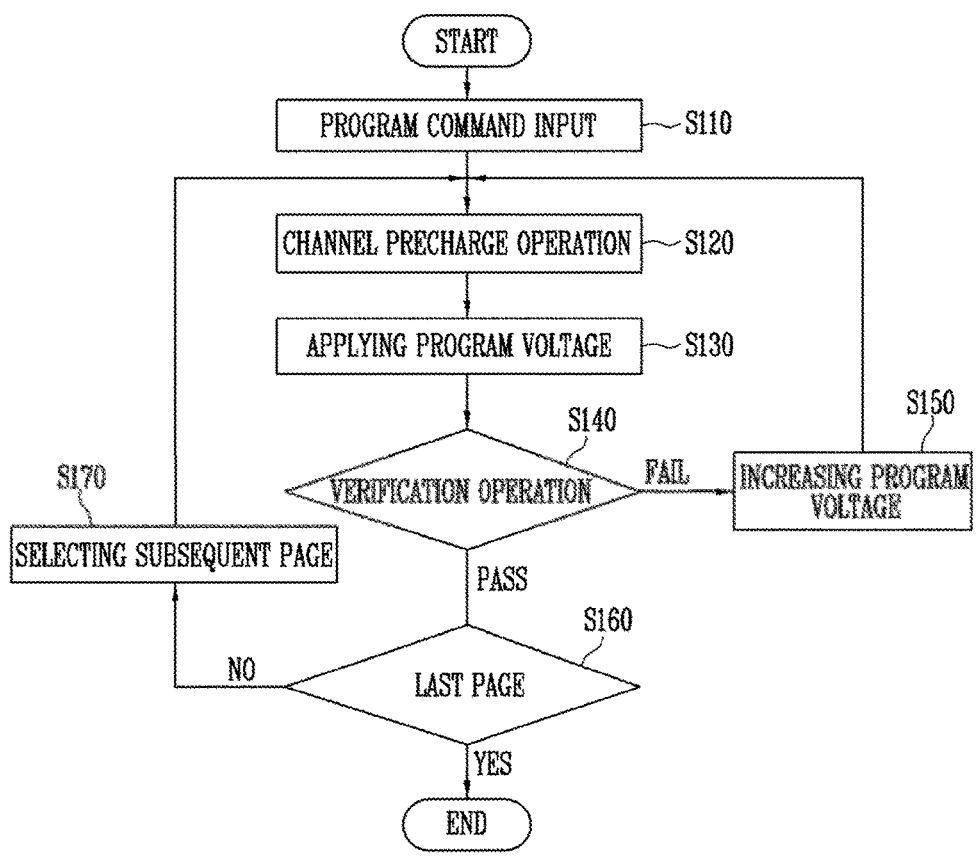
FIG. 4 is a flowchart illustrating a method of operating the semiconductor memory device according to an embodiment of the present disclosure.

FIG. 4 is a flowchart illustrating a method of operating the semiconductor memory device according to an embodiment of the present disclosure.

Figure 5:
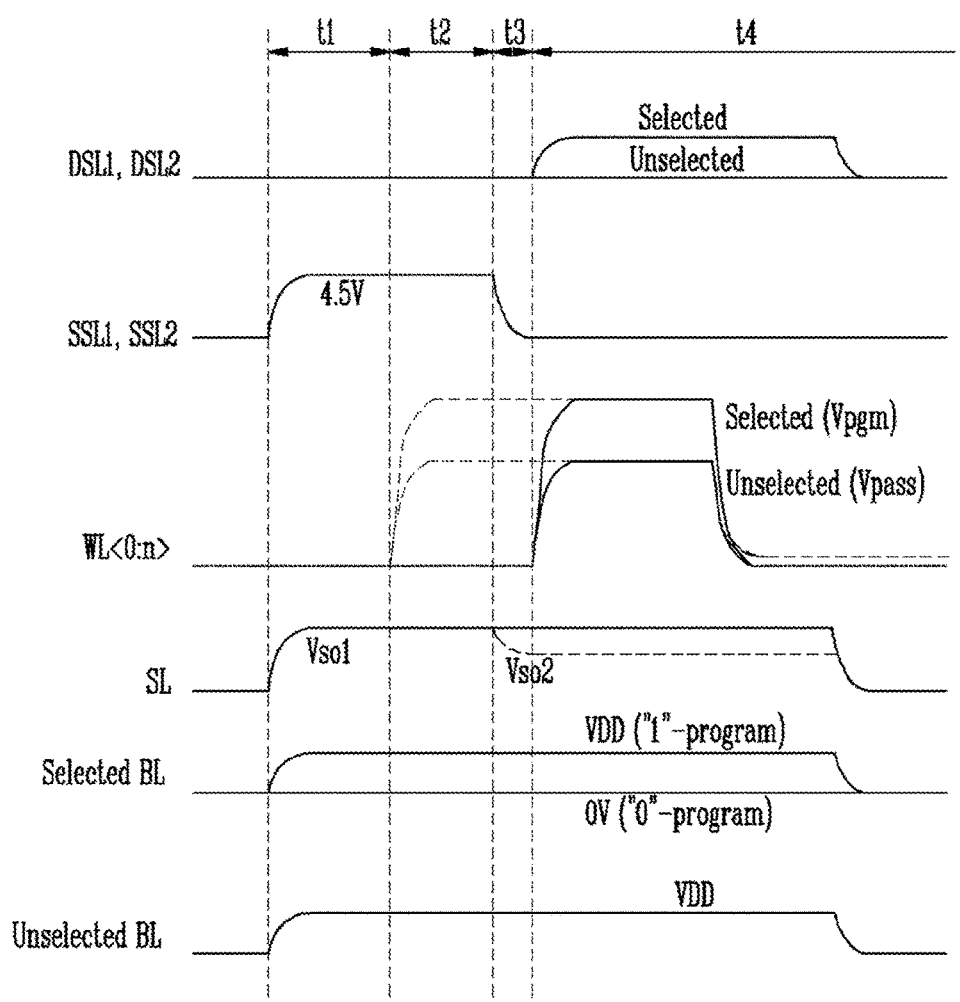
FIG. 5 is a diagram illustrating examples of waveforms of signals that are used for operating the semiconductor memory device according to an embodiment of the present disclosure.

FIG. 5 is a diagram illustrating examples of waveforms of signals that are used for operating the semiconductor memory device according to an embodiment of the present disclosure.

The method of operating the semiconductor memory device according to an embodiment of the present disclosure will be described with reference to FIGS. 1 to 5.

In an embodiment, a reverse program operation of successively programming the memory cells in a sequence from the memory cell Cn adjacent to the drain select transistor DST1 and DST2 to the memory cell C0 adjacent to the source select transistor SST1 and SST2 will be described as an example.

In an embodiment, a program operation may include a plurality of steps S110 to S170. For example, the first bit line BL1 is selected between the first bit line BL1 and the second bit line BL2 and the first memory string STRING1 is selected between the plurality of memory strings STRING1 and STRING3. The first bit line BL1 may be defined as an odd-numbered bit line of the plurality of bit lines BL1 to BLm. The second bit line BL2 may be defined as an even-numbered bit line of the plurality of bit lines BL1 to BLm.

In the step S110, a program command CMD may be input.

When the program command CMD is input to the control logic 140 from an external device, the control logic 140 may control the peripheral circuits to perform a program operation of the semiconductor memory device. The read-and-write circuit 130 may temporarily store data DATA inputted from the external device to program the data DATA in the semiconductor memory device.

In the step S120, a channel precharge operation may be performed during time periods t1 and t2.

In an embodiment, the reverse program operation may a program operation that is performed on a page basis from a page including the memory cell Cn adjacent to the drain select transistor (e.g., DST1). Therefore, when the channels of the plurality of memory strings STRING1 to STRING4 are precharged through the plurality of bit lines BL1 to BLm, a charge transfer may be suppressed due to threshold voltages of programmed ones of memory cells between a selected memory cell and the drain select transistor DST1. Therefore, the channel of the memory cells between the selected memory cell and the source select transistor SST1 may not be precharged to a target precharge potential level. In an embodiment of the present embodiment, the channel precharge operation may be performed through the source line SL to precharge the channel of the memory cells between the selected memory cell and the source select transistor SST1 to the target precharge potential level.

During the channel precharge operation, under the control of the control logic 140, the voltage generation circuit 150 may generate and output a source line voltage VSL with a first precharge potential Vso1, and first and second source select line voltages VSSL1 and VSSL2 with a turn-on potential level of about 4.5V. In an embodiment, a first drain select line voltage VDSL1 and a second drain select line voltage VDSL2 are outputted with a turn-off potential level of 0V. The address decoder 120 may apply, to a selected memory block, the source line voltage VSL, the first source select line voltage VSSL1, the second source select line voltage VSSL2, the first drain select line voltage VDSL1, and the second drain select line voltage VDSL2, which are generated from the voltage generation circuit 150.

As a result, the source select transistors SST1 and SST2 of the memory cell block may be turned on, and the channels of the memory strings STRING1 to STRING4 may be precharged to a level of the first precharge potential Vso1.

The read-and-write circuit 130 may control the potential level of a corresponding bit line in accordance with the temporarily stored data DATA. That is, the potential level of the selected first bit line BL1 may be adjusted according to the data DATA stored in the corresponding page buffer PB1. For instance, when the data bit stored in the page buffer PB1 is "0," the first bit line BL1 may be controlled to have a level of a program allowable voltage (e.g., 0V). When the data bit stored in the page buffer PB1 is "1," the first bit line BL1 may be controlled to have a level of a program inhibit voltage (e.g., VDD). A program inhibit voltage may be applied to the unselected second bit line BL2. In other words, the unselected second bit line BL2 may be controlled to a level of the power supply voltage (VDD), which is a program inhibit voltage, regardless of data DATA stored in the page buffer PB2.

In the step S30, a program voltage may be applied during time periods t3 and t4.

In the time period t3 during a program voltage application operation, under the control of the control logic 140, the voltage generation circuit 150 and the address decoder 120 may discharge the first and second source select line voltages VSSL1 and VSSL2 of about 4.5V to a logic low level (e.g., 0V). As a result, the source select transistors SST1 and SST2 may be turned off.

In this case, the source line voltage VSL may be maintained at the first precharge potential Vso1. Alternatively, the potential level of the source line voltage VSL may decrease to a second precharge potential Vso2 lower than the first precharge potential Vso1. As the potential level of the source line voltage VSL decreases from the first precharge potential Vso1 to the second precharge potential Vos2, power consumption can be reduced.

Subsequently, in the time period t4, the voltage generation circuit 150 and the address decoder 120 may apply a first drain select line voltage VDSL1 having a logic high level to the drain select line DSL1 coupled to the drain select transistor DST1 of the selected memory string STRING1. The first drain select line voltage VDSL1 may have a potential level of about 2V. The first drain select line voltage VDSL1 may be a voltage that is higher than the threshold voltage of the drain select transistor DST1 and has a potential level equal to or lower than that of the bit line charge voltage VDD corresponding to "1" data bit.

The second drain select line voltage VDSL2 of 0V of the drain select line DSL2 coupled to the drain select transistor DST2 of the unselected memory string STRING3 may be maintained.

Therefore, the drain transistor DST1 of the memory string STRING1 may be turned on by the first drain select line voltage VDSL1. Thus, the channel potential of the memory string STRING1 may be maintained at the precharge level. Alternatively, the channel potential of the memory string STRING1 may be discharged to the low level depending on the potential level of the first bit line BL1. The drain select transistors DST2 of the unselected memory strings STRING3 and STRING4 may be maintained in a turn-off state by the second drain select line voltage VDSL2. Thus, the channel potential of the unselected memory strings STRING3 and STRING4 may be maintained at the precharge level. The drain transistor DST1 of the unselected memory string STRING2 may be maintained in the turn-off state by the second bit line BL2 to which the first drain select line voltage VDSL1 or the power voltage VDD is applied.

In the time period t4, the voltage generation circuit 150 may generate a program voltage Vpgm and a pass voltage Vpass under the control of the control logic 150. The address decoder 120 may apply the program voltage Vpgm to a selected word line of the selected memory block and apply the pass voltage Vpass to unselected word lines of the selected memory block. The channel potential level of the unselected memory strings STRING2 to STRING4 may be boosted by the program voltage Vpgm and the pass voltage Vpass.

As a result, the selected memory cell of the selected memory string STRING1 may be programmed as the threshold voltage thereof is increased or maintained depending on the potential of the corresponding first bit line BL1. The boosted channel potential may inhibit the memory cells of the unselected memory strings STRING2 to STRING4 from being programmed.

The application of the program voltage Vpgm and the pass voltage Vpass may start during the time period t2 of the channel precharge operation.

Thereafter, the program voltage Vpgm and the pass voltage Vpass applied to the word lines WL<0:n> may be discharged. When the potential level of the word lines WL<0:n> is discharged, the word lines WL<0:n> may be discharged to a set voltage (e.g., about 2V) higher than the ground voltage. In this case, even after the program operation has been completed, the word lines WL<0:n> can be maintained at the set voltage level, and the channels of the memory cell array 110 can be maintained at a low boost level corresponding to a set potential level. Therefore, characteristics of changes in the threshold voltage distribution of the memory cells can be improved.

Table 1 shows potential levels of signals during the channel precharge operation and the program voltage application operation.

TABLE 1

|  | Channel precharge operation | | Program voltage applying operation | |
| --- | --- | --- | --- | --- |
|  | t1 | t2 | t3 | t4 |
| SL | Vso1 | Vso1 | Vso1 or Vso2 | Vso1 or Vso2 |
| SSL1(selected) | On(4.5 V) | On(4.5 V) | Off(0 V) | Off(0 V) |
| SSL2(unselected) | On(4.5 V) | On(4.5 V) | Off(0 V) | Off(0 V) |
| DSL1(selected) | Off(0 V) | Off(0 V) | Off(0 V) | On(2 V) |
| DSL2(unselected) | Off(0 V) | Off(0 V) | Off(0 V) | Off(0 V) |
| BL1(selected) | 0 V or VDD | 0 V or VDD | 0 V or VDD | 0 V or VDD |
| BL2(unselected) | VDD | VDD | VDD | VDD |

In the step S140, a verification operation may be performed.

After the program voltage application operation S130 has been completed, the verification operation for the selected memory cells may be performed.

The verification operation may include applying a verification voltage to the word lines of the selected memory cell of the selected memory string STRING1, and sensing, using the read-and-write circuit 130, the potential level or current level of the first bit line BL1 coupled to the selected memory string STRING1.

In the step S150, the program voltage may be increased.

If the selected memory cell has failed the verification during the verification operation S140, the program voltage Vpgm may be increased by a set voltage, and the program operation may be re-performed from the channel precharge operation S120.

In the step S160, the page address may be checked.

If the selected memory cell has passed the verification during the verification operation S140, the page address of the current program operation is checked, and it is determined whether the page address of the current program operation is the last page address. In the case of the reverse program operation, the page address corresponding to the memory cell C0 may be the last page address. When the page address of the current last program operation is the last page address, the program operation is finished.

In the step S170, a subsequent page may be selected.

In the page address determination step S160, if the page address of the current program operation is not the last page address, a subsequent page may be selected, and the program operation may be re-performed from the channel precharge operation S120.

After a program operation for the odd-numbered bit lines of the selected page has been completed and then a program operation for the even-numbered bit lines of the selected page has been performed in the same manner as that of the above-mentioned program operation, a program operation for a subsequent page is performed.

According to an embodiment, as the channel is precharged through the source line, the channels of the memory strings can be uniformly precharged. Furthermore, the potential levels of the selected bit line and the unselected bit line can be controlled, and a coupling noise phenomenon between the bit lines can be mitigated.

Figure 6:
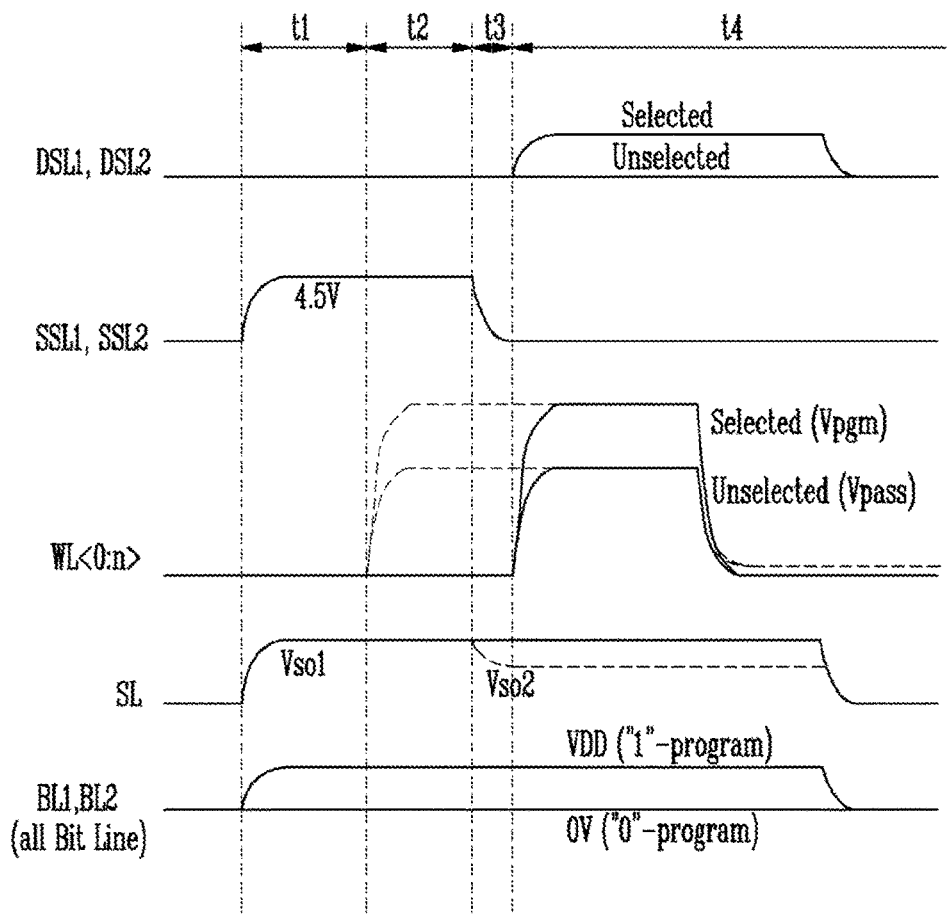
FIG. 6 is a diagram illustrating examples of waveforms of signals that are used for operating a semiconductor memory device according to an embodiment of the present disclosure.

FIG. 6 is a diagram illustrating examples of waveforms of signals that are used for operating a semiconductor memory device according to an embodiment of the present disclosure.

The method of operating the semiconductor memory device according to an embodiment of the present disclosure will be described with reference to FIGS. 1 to 4 and 6.

According to an embodiment, a method of programming the semiconductor memory device may be performed in a situation where all of the plurality of bit lines BL1 to BLm are selected, the memory strings STRING1 and STRING2 sharing the same drain select line (e.g., DSL1) are selected, and the memory strings STRING3 and STRING4 sharing the other drain select line (e.g., DSL2) are unselected.

In the step S110, a program command CMD may be input.

When the program command CMD is input to the control logic 140, the control logic 140 may control the peripheral circuits to perform a program operation of the semiconductor memory device. The page buffers PB1 to PBm of the read-and-write circuit 130 may temporarily store data DATA inputted from an external device to program the data DATA in the semiconductor memory device.

In the step S120, a channel precharge operation may be performed during time periods t1 and t2.

In an embodiment, the channel precharge operation may be performed through the source line SL.

During the channel precharge operation, under the control of the control logic 140, the voltage generation circuit 150 may generate and output a source line voltage VSL with a first precharge potential Vso1, and first and second source select line voltages VSSL1 and VSSL2 with a turn-on potential level of about 4.5V. In an embodiment, the first drain select line voltage VDSL1 and the second drain select line voltage VDSL2 are outputted with a turn-off potential level of 0V. The address decoder 120 may apply, to a selected memory block, the source line voltage VSL, the first source select line voltage VSSL1, the second source select line voltage VSSL2, the first drain select line voltage VDSL1, and the second drain select line voltage VDSL2, which are generated from the voltage generation circuit 150.

As a result, the source select transistors SST1 and SST2 of the memory cell block may be turned on, and the channels of the memory strings STRING1 to STRING4 may be precharged to a level of the first precharge potential Vso1.

The read-and-write circuit 130 may control the potential level of corresponding bit lines BL1 to BLm in accordance with the temporarily stored data DATA. For instance, when the data bit stored in the page buffer PB1 is "0,", the first bit line BL1 may be controlled to have a level of a program allowable voltage (e.g., 0V). When the data bit stored in the page buffer PB1 is "1," the first bit line BL1 may be controlled to have a level of a program inhibit voltage (e.g., VDD).

In the step S30, a program voltage may be applied during time periods t3 and t4.

In the time period t3 during a program voltage application operation, under the control of the control logic 140, the voltage generation circuit 150 and the address decoder 120 may discharge the first and second source select line voltages VSSL1 and VSSL2 of about 4.5V to a logic low level (e.g., 0V). As a result, the source select transistors SST1 and SST2 may be turned off.

In this case, the source line voltage VSL may be maintained at the first precharge potential Vso1. Alternatively, the potential level of the source line voltage VSL may decrease to a second precharge potential Vso2 lower than the first precharge potential Vso1.

Subsequently, in the time period t4, the voltage generation circuit 150 and the address decoder 120 may apply a first drain select line voltage VDSL1 having a logic high level to the drain select line DSL1 coupled to the drain select transistors DST1 of the selected memory strings STRING1 and STRING2. The first drain select line voltage VDSL1 may have a potential level of about 2V. The first drain select line voltage VDSL1 may be a voltage that is higher than the threshold voltage of the drain select transistor DST1 and has a potential level equal to or lower than that of the bit line charge voltage VDD corresponding to "1" data bit.

The second drain select line voltage VDSL2 of 0V of the drain select line DSL2 coupled to the drain select transistors DST2 of the unselected memory strings STRING3 and STRING4 may be maintained.

Therefore, the drain transistors DST1 of the selected memory strings STRING1 and STRING2 may be turned on by the first drain select line voltage VDSL1. Thus, the channel potential of the selected memory strings STRING1 and STRING2 may be maintained at the precharge level. Alternatively, the channel potential of the memory string STRING1 may be discharged to the low level depending on the potential levels of the first bit line BL1 and the second bit line BL2. Furthermore, the drain select transistors DST2 of the unselected memory strings STRING3 and STRING4 may be maintained in a turn-off state by the second drain select line voltage VDSL2, so that the channel potential of the unselected memory strings STRING3 and STRING4 may be maintained at the precharge level.

In the time period t4, the voltage generation circuit 150 may generate a program voltage Vpgm and a pass voltage Vpass under the control of the control logic 150. The address decoder 120 may apply the program voltage Vpgm to a selected word line of the selected memory block and apply the pass voltage Vpass to unselected word lines of the selected memory block. The channel potential level of the unselected memory strings STRING3 and STRING4 may be boosted by the program voltage Vpgm and the pass voltage Vpass.

As a result, the selected memory cells of the selected memory strings STRING1 and STRING2 may be programmed as the threshold voltages thereof are increased or maintained. The boosted channel potential may inhibit the memory cells of the unselected memory strings STRING3 and STRING4 from being programmed.

The application of the program voltage Vpgm and the pass voltage Vpass may start during the time period t2 of the channel precharge operation.

Thereafter, the program voltage Vpgm and the pass voltage Vpass applied to the word lines WL<0:n> may be discharged. When the potential level of the word lines WL<0:n> is discharged, the word lines WL<0:n> may be discharged to a set voltage (e.g., about 2V) higher than the ground voltage. In this case, even after the program operation has been completed, the word lines WL<0:n> can be maintained at the set voltage level, and the channels of the memory cell array 110 can be maintained at a low boost level corresponding to the set potential level. Therefore, characteristics of changes in the threshold voltage distribution of the memory cells can be improved.

Table 2 shows potential levels of signals during the channel precharge operation and the program voltage application operation.

TABLE 2

| | Channel precharge operation | | Program voltage applying operation | |
| --- | --- | --- | --- | --- |
| SL | t1 Vso1 | t2 Vso1 | t3 Vso1 or Vso2 | t4 Vso1 or Vso2 |
| SSL1(selected) | On(4.5 V) | On(4.5 V) | Off(0 V) | Off(0 V) |
| SSL2(unselected) | On(4.5 V) | On(4.5 V) | Off(0 V) | Off(0 V) |
| DSL1(selected) | Off(0 V) | Off(0 V) | Off(0 V) | On(2 V) |
| DSL2(unselected) | Off(0 V) | Off(0 V) | Off(0 V) | Off(0 V) |
| BL1 and BL2 | 0 V or VDD | 0 V or VDD | 0 V or VDD | 0 V or VDD |

In the step S140, a verification operation may be performed.

After the program voltage application operation S130 has been completed, the verification operation for the selected memory cells may be performed.

The verification operation may include applying a verification voltage to the word lines of the selected memory cells of the selected memory strings STRING1 and STRING2, and sensing, using the read-and-write circuit 130, the potential levels or current levels of the first and second bit lines BL1 and BL2 coupled to the selected memory strings STRING1 and STIRNG2.

In the step S150, the program voltage may be increased.

If the selected memory cell has failed the verification during the verification operation S140, the program voltage Vpgm may be increased by a set voltage, and the program operation may be re-performed from the channel precharge operation S120.

In the step S160, the page address may be checked.

If the selected memory cell has passed the verification during the verification operation S140, the page address of the current program operation is checked, and it is determined whether the page address of the current program operation is the last page address. In the case of the reverse program operation, the page address corresponding to the memory cell C0 may be the last page address. When the page address of the current last program operation is the last page address, the program operation is finished.

In the step S170, a subsequent page may be selected.

In the page address determination step S160, when the page address of the current last program operation is not the last page address, a subsequent page may be selected, and the program operation may be re-performed from the channel precharge operation S120.

According to an embodiment, as the channel is precharged through the source line, the channels of the memory strings can be uniformly precharged. Furthermore, the potential levels of all of the bit lines can be precharged or maintained in the potential level of 0V depending on data stored in the page buffers, and power consumption can be reduced compared to that of the conventional method in which all bit lines are precharged.

Figure 7:
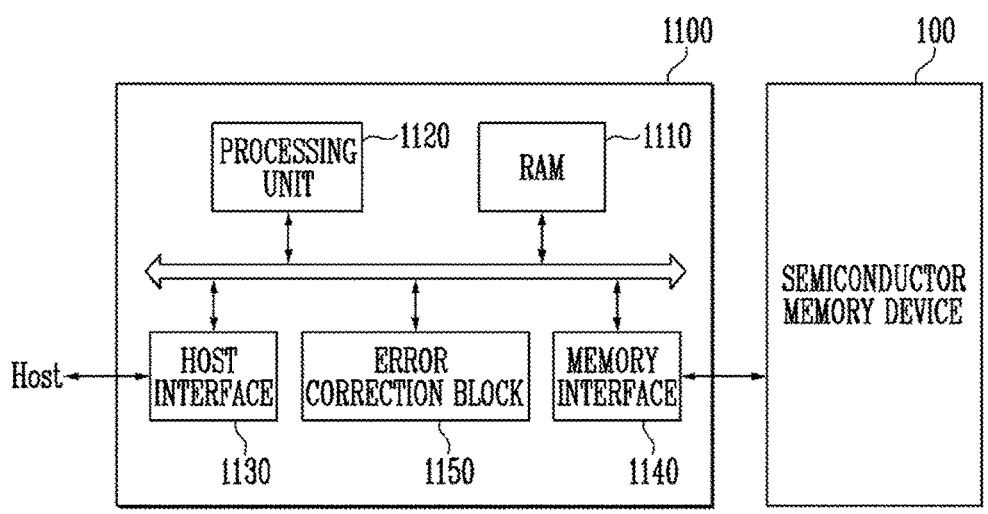
FIG. 7 is a diagram illustrating an example of a memory system including the semiconductor memory device of FIG. 1.

FIG. 7 is a diagram illustrating an example of a memory system including the semiconductor memory device of FIG. 1.

Referring FIG. 7, the memory system 1000 may include the semiconductor memory device 100 and a controller 1100.

The semiconductor memory device 100 may have the same configuration and may perform the same operation as those of the semiconductor memory device described with reference to FIG. 1. Repetitive explanations, therefore, will be made only when necessary.

The controller 1100 may be coupled to a host and the semiconductor memory device 100. In response to a request from the host, the controller 1100 may access the semiconductor memory device 100. For example, the controller 1100 controls read, write, remove, and background operations of the semiconductor memory device 100. The controller 1100 may provide an interface between the host and the semiconductor memory device 100. The controller 1100 may drive firmwares for controlling the semiconductor memory device 100.

The controller 1100 may include a RAM (random access memory) 1110, a processing circuit 1120, a host interface 1130, a memory interface 1140, and an error correction circuit 1150. The RAM 1110 may be used as at least one of an operating memory for the processing unit 1120, a cache memory provided between the semiconductor memory device 100 and the host, and a buffer memory provided between the semiconductor memory device 100 and the host. The processing unit 1120 may control the overall operation of the controller 1100. In addition, the controller 1100 may temporarily store program data provided from the host during the write operation.

The host interface 1130 may include a protocol for performing data exchanges between the host and the controller 1100. For example, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or a NOR interface.

The error correction circuit 1150 may use an error correction code (ECC) to detect and correct errors in data received from the semiconductor memory device 100. The processing unit 1120 may adjust the read voltage depending on an error detection result from the error correction circuit 1150, and control the semiconductor memory device 100 to reread. In an embodiment, the error correction circuit may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. Examples of the memory card may include a personal computer memory card international association (PCMCIA) card, a compact flash (CF) card, a smart media card (SMC), a memory stick multimedia card (MMC, RS-MMC, or MMCmicro), an SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes semiconductor memory devices therein to store data. When the memory system 1000 is the SSD, the operation speed of the host connected to the memory system 2000 may be improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be embedded in a package type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 8:
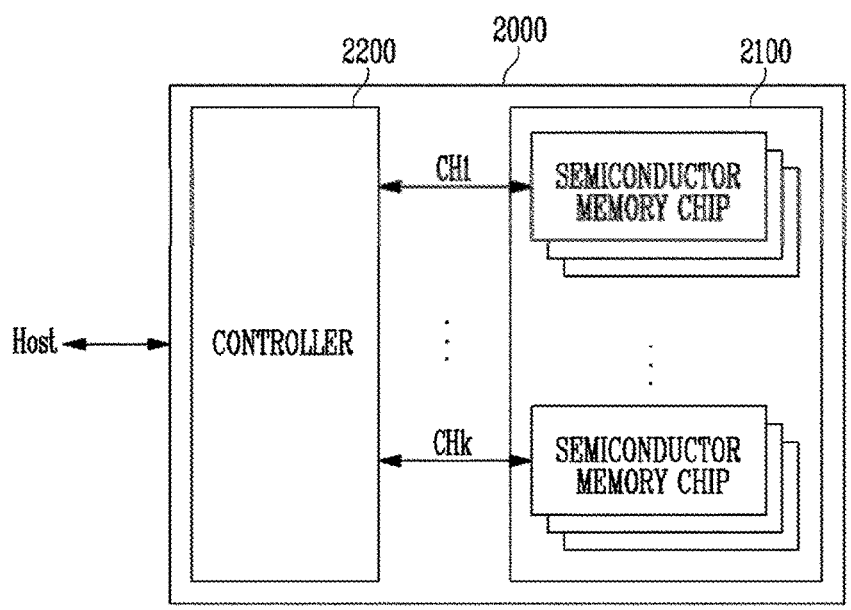
FIG. 8 is a diagram illustrating an application example of the memory system of FIG. 7.

FIG. 8 is a diagram illustrating an application example of the memory system of FIG. 7.

Referring FIG. 8, the memory system 2000 may include the semiconductor memory device 2100 and a controller 2200. The semiconductor memory device 2100 may include a plurality of memory chips. The semiconductor memory chips may be divided into a plurality of groups.

In FIG. 8, it is illustrated that each of the plurality of groups communicates with the controller 2200 through first to $k^{th}$ channels CH1 to CHk. Each semiconductor memory chip may operate in the same manner as that of an embodiment of the semiconductor memory device 100 described with reference to FIG. 1.

Each group may communicate with the controller 2200 through one common channel. The controller 2200 may have the same configuration as that of the controller 1100 described with reference to FIG. 7 and may control a plurality of memory chips of the semiconductor memory device 2100 through the plurality of channels CH1 to CHk.

Figure 9:
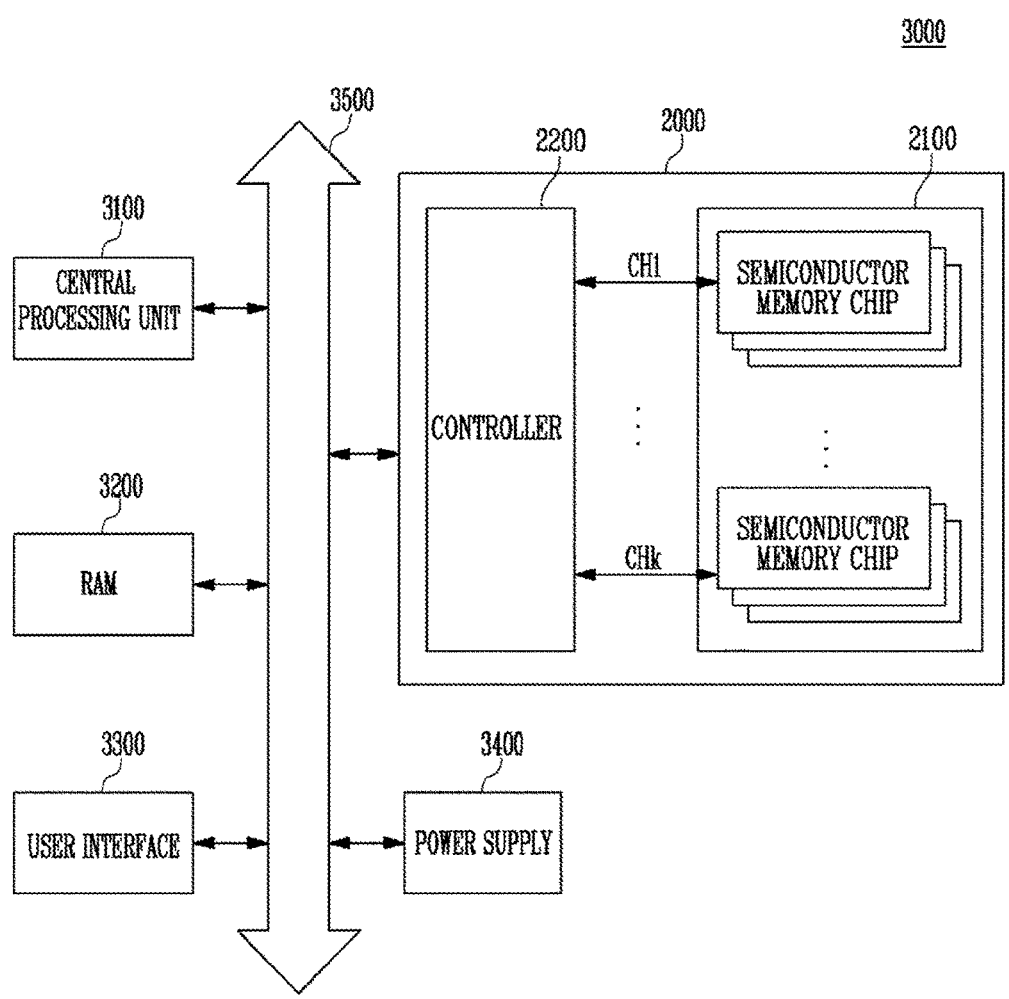
FIG. 9 is a diagram illustrating an example of a computing system including the memory system illustrated with reference to FIG. 8.

FIG. 9 is a diagram illustrating an example of a computing system including the memory system illustrated with reference to FIG. 8.

Referring to FIG. 9, the computing system 3000 may include a central processing unit 3100, a RAM 3200, a user interface 3300, a power supply 3400, a system bus 3500, and a memory system 2000.

The memory system 2000 may be electrically connected to the CPU 3100, the RAM 3200, the user interface 3300, and the power supply 3400 through the system bus 3500. Data provided through the user interface 3300 or processed by the CPU 3100 may be stored in the memory system 2000.

In FIG. 9, the semiconductor memory device 2100 is illustrated as being connected to the system bus 3500 through the controller 2200. However, the semiconductor memory device 2100 may be directly connected to the system bus 3500. The function of the controller 2200 may be performed by the CPU 3100 and the RAM 3200.

In FIG. 9, the memory system 2000 described with reference to FIG. 8 may be provided in the computing system 3000. However, the memory system 2000 may be replaced with the memory system 1000 described with reference to FIG. 7. In an embodiment, the computing system 3000 may include all the memory systems 1000 and 2000 described with reference to FIGS. 7 and 8.

According to various embodiments of the present disclosure, a program disturb phenomenon of an unselected memory string during a program operation of a semiconductor memory device can be mitigated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory strings;
   a peripheral circuit configured to perform a program operation for the memory cell array;
   a control logic configured to control the peripheral circuit during a channel precharge operation of the program operation; and
   a source line precharge path configured to precharge channels of the plurality of memory strings through a source line of the memory cell array,
   wherein the peripheral circuit controls, according to program data, a potential level of a selected one of a plurality of bit lines coupled to the plurality of memory strings during the channel precharge operation,
   wherein the peripheral circuit applies a first source line voltage to the source line during the channel precharge operation, and maintains the first source line voltage or applies a second source line voltage lower than the first source line voltage thereto when a program voltage is applied.

2. The semiconductor memory device according to claim 1, wherein the plurality of memory strings are coupled between the plurality of bit lines and the source line, and wherein each of the bit lines is coupled to at least two of the memory strings.

3. The semiconductor memory device according to claim 2, wherein:
   a first memory string coupled to a first bit line of the plurality of bit lines and a second memory string coupled to a second bit line of the plurality of bit lines share a first drain select line;
   a third memory string coupled to the first bit line and a fourth memory string coupled to the second bit line share a second drain select line; and
   the first to fourth memory strings share a plurality of word lines.

4. The semiconductor memory device according to claim 3, wherein the first memory string and the fourth memory string share a first source select line, and the second memory string and the third memory string share a second source select line.

5. The semiconductor memory device according to claim 4, wherein the peripheral circuit applies a program inhibit voltage to unselected ones of the plurality of bit lines during the channel precharge operation.

6. The semiconductor memory device according to claim 3, wherein the control logic controls the peripheral circuit such that the program voltage applying operation is performed after the channel precharge operation.

7. The semiconductor memory device according to claim 6, wherein, during the program voltage applying operation, the peripheral circuit applies a control voltage to a selected one of the first and second drain select lines and applies a turn-off voltage to a remaining unselected drain select line.

8. The semiconductor memory device according to claim 7, wherein the control voltage is higher than a threshold voltage of a drain select transistor included in the plurality of memory strings and has a potential level equal to or lower than a potential level of a bit line charge voltage.

9. The semiconductor memory device according to claim 7, wherein, during the program voltage applying operation, the peripheral circuit applies a program voltage to a selected one of the plurality of word lines and applies a pass voltage to unselected ones of the word lines.

10. The semiconductor memory device according to claim 9, wherein the peripheral circuit applies the program voltage and the pass voltage to the plurality of word lines before applying the control voltage to the selected drain select line.

11. A method of operating a semiconductor memory device, comprising:
   providing a memory cell block including a plurality of memory strings coupled between a plurality of bit lines and one or more source lines;
   precharging channels of the plurality of memory strings by applying a first source voltage to the one or more source lines;
   controlling a potential level of a selected one of the bit lines according to program data while precharging the channels of the plurality of memory strings;
   electrically coupling a selected one of the plurality of memory strings to the selected bit line and applying a program voltage thereto; and
   lowering a voltage applied to the one or more sources lines to a second source voltage when the program voltage is applied.

12. The method according to claim 11, wherein, when controlling the potential level of the selected bit line, a program inhibit voltage is applied to an unselected one of the plurality of bit lines.

13. The method according to claim 11, wherein at least two memory strings are coupled to each of the plurality of bit lines, and wherein the at least two memory strings are respectively coupled to different drain select lines.

14. The method according to claim 11, wherein:
   a first memory string coupled to a first bit line of the plurality of bit lines and a second memory string coupled to a second bit line of the bit lines share a first drain select line;
   a third memory string coupled to the first bit line and a fourth memory string coupled to the second bit line share a second drain select line; and
   the first to fourth memory strings share a plurality of word lines.

15. The method according to claim 14, wherein applying the program voltage comprise applying a control voltage to a selected one of the first and second drain select lines, and applying a turn-off voltage to a remaining unselected drain select line.

16. A method of operating a semiconductor memory device, comprising:
   providing a memory cell block including a plurality of memory strings coupled between a plurality of bit lines and one or more source lines;
   precharging channels of the plurality of memory strings by applying a first source voltage to the one or more source lines;
   controlling a potential level of the bit lines according to program data while precharging the channels of the plurality of memory strings; and
   electrically coupling a selected one of the plurality of memory strings to the bit lines, and applying a program voltage thereto; and
   lowering a voltage applied to the one or more source lines to a second source voltage when the program voltage is applied.

17. The method according to claim 16, wherein bit lines to which a program inhibit voltage is applied according to the program data are electrically separated from the plurality of memory strings.

18. The method according to claim 16, wherein:
   a first memory string coupled to a first bit line of the plurality of bit lines and a second memory string coupled to a second bit line of the plurality of bit lines share a first drain select line;
   a third memory string coupled to the first bit line and a fourth memory string coupled to the second bit line share a second drain select line; and
   the first to fourth memory strings share a plurality of word lines.

19. The method according to claim 18, wherein applying the program voltage comprise applying a control voltage to a selected one of the first and second drain select lines, and applying a turn-off voltage to a remaining unselected drain select line.

* * * * *